(12) United States Patent
Finders

(10) Patent No.: US 9,513,109 B2
(45) Date of Patent: Dec. 6, 2016

(54) LITHOGRAPHIC MASK, LITHOGRAPHIC APPARATUS AND METHOD

(71) Applicant: ASML NETHERLANDS B.V., Veldhoven (NL)

(72) Inventor: Jozef Maria Finders, Veldhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 71 days.

(21) Appl. No.: 14/608,011

(22) Filed: Jan. 28, 2015

(65) Prior Publication Data
US 2015/0138568 A1 May 21, 2015

Related U.S. Application Data

(63) Continuation of application No. 13/743,231, filed on Jan. 16, 2013, now Pat. No. 8,974,989.

(60) Provisional application No. 61/589,027, filed on Jan. 20, 2012, provisional application No. 61/587,941, filed on Jan. 18, 2012, provisional application No. 61/587,587, filed on Jan. 17, 2012.

(51) Int. Cl.
*G03F 1/38* (2012.01)
*G01B 11/06* (2006.01)

(52) U.S. Cl.
CPC ............... *G01B 11/06* (2013.01); *G03F 1/38* (2013.01)

(58) Field of Classification Search
CPC ... G03F 1/38; G03F 7/70216; G03F 7/70341
USPC .......................................................... 430/5
See application file for complete search history.

(56) References Cited

U.S. PATENT DOCUMENTS

| | | | |
|---|---|---|---|
| 6,623,895 B2 | 9/2003 | Chen et al. | |
| 8,252,487 B2 | 8/2012 | Dierichs et al. | |
| 2002/0015899 A1 | 2/2002 | Chen et al. | |
| 2005/0136334 A1 | 6/2005 | Dierichs et al. | |
| 2005/0277035 A1* | 12/2005 | Yamamoto | G03F 7/70641 430/30 |
| 2007/0178392 A1 | 8/2007 | Yoshizawa et al. | |
| 2009/0148780 A1 | 6/2009 | Yasuzato | |
| 2009/0258319 A1 | 10/2009 | Nagai et al. | |
| 2011/0249244 A1* | 10/2011 | Leewis | G03F 7/706 355/27 |

FOREIGN PATENT DOCUMENTS

| | | |
|---|---|---|
| CN | 1695093 | 11/2005 |
| JP | H11-143048 | 5/1999 |
| JP | 2001-356466 | 12/2001 |

(Continued)

OTHER PUBLICATIONS

Japanese Office Action mailed Sep. 15, 2016 in corresponding Japanese Patent Application No. 2015-052908.

*Primary Examiner* — Stephen Rosasco
(74) *Attorney, Agent, or Firm* — Pillsbury Winthrop Shaw Pittman LLP

(57) ABSTRACT

A lithographic mask has a substrate substantially transmissive for radiation of a certain wavelength, the substrate having a radiation absorbing material in an arrangement, the arrangement configured to apply a pattern to a cross-section of a radiation beam of the certain wavelength, wherein the absorbing material has a thickness which is substantially equal to the certain wavelength divided by a refractive index of the absorbing material.

18 Claims, 6 Drawing Sheets

(56) References Cited

FOREIGN PATENT DOCUMENTS

| JP | 2002-268201 | 9/2002 |
| JP | 2007-271712 | 10/2007 |
| JP | 2009-122566 | 6/2009 |
| JP | 2013-003300 | 1/2013 |
| TW | I251719 | 3/2006 |

* cited by examiner

LITHOGRAPHIC MASK, LITHOGRAPHIC APPARATUS AND METHOD

This application is a continuation application of U.S. patent application Ser. No. 13/743,231, filed on Jan. 16, 2013, now allowed, which claims priority and benefit under 35 U.S.C. §119(e) to U.S. Provisional Patent Application No. 61/587,587, filed on Jan. 17, 2012, U.S. Provisional Patent Application No. 61/587,941, filed on Jan. 18, 2012 and U.S. Provisional Patent Application No. 61/589,027, filed on Jan. 20, 2012. The entire content of each of the foregoing applications is incorporated herein by reference.

FIELD

The present invention relates to a lithographic mask, to a lithographic apparatus and to a device manufacturing method.

BACKGROUND

A lithographic apparatus is a machine that applies a desired pattern onto a target portion of a substrate. Lithographic apparatus can be used, for example, in the manufacture of integrated circuits (ICs). In that circumstance, a mask, which is alternatively referred to as a mask or a reticle, may be used to generate a circuit pattern corresponding to an individual layer of the IC, and this pattern can be imaged onto a target portion (e.g. comprising part of, one or several dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the beam in a given direction (the "scanning"-direction) while synchronously scanning the substrate parallel or anti parallel to this direction.

Progressive improvements of a lithographic apparatus have been made which have allowed patterns with smaller resolutions to be projected onto substrates. One such improvement involves providing a liquid between a projection system of a lithographic apparatus and a substrate. This provides the projection system with a numerical aperture (NA) greater than 1.0 (e.g. 1.35NA).

SUMMARY

When a high numerical aperture is used (such as when using immersion lithography), the mask used to pattern radiation may give rise to an unwanted phase effect. Specifically, the topography of the mask (i.e. unevenness across the surface of the mask) may introduce an unwanted phase offset into the patterned radiation. Such a phase offset may reduce the accuracy with which a pattern is projected onto a substrate.

It is desirable to provide, for example, a mask which obviates or mitigates one or more problems of the art, whether defined herein or elsewhere.

According to an aspect of the invention, there is provided a lithographic mask comprising a substrate which is substantially transmissive for radiation of a certain (e.g., pre-determined) wavelength, the substrate having a radiation absorbing material in an arrangement, the arrangement configured to apply a pattern to a cross-section of a radiation beam of the certain wavelength, wherein the absorbing material has a thickness which is substantially equal to the certain wavelength divided by a refractive index of the absorbing material.

According to a further aspect of the invention, there is provided a lithographic mask comprising a substrate which is substantially transmissive for radiation of a certain wavelength, the substrate having a radiation absorbing material in an arrangement, the arrangement configured to apply a pattern to a cross-section of a radiation beam of the certain wavelength, wherein the absorbing material has a thickness equal to or within a first range of 10% of the radiation wavelength divided by a refractive index of the absorbing material.

According to a further aspect of the invention, there is provided a lithographic mask comprising a substrate which is substantially transmissive for radiation of a certain wavelength, the substrate having a radiation absorbing material in an arrangement, the arrangement configured to apply a pattern to a cross-section of a radiation beam of the certain wavelength, wherein the absorbing material has a thickness equal to or within a second range of 20% of the radiation wavelength divided by a refractive index of the absorbing material.

The thickness of the absorbing material within the first range or the second range may be further chosen depending on a phase shift characteristic and resulting image contrast provided by the absorbing material to radiation of the certain wavelength.

The thickness of the absorbing material may be chosen to optimize the phase shift characteristic and resulting image contrast provided by the absorbing material to radiation of the certain wavelength.

The absorbing material may comprise a plurality of material layers having different refractive indices, and the refractive index of the absorbing material may be taken as being the average of the refractive indices of the material layers, the average taking into account the proportions of the different materials through which the radiation beam passes.

The lithographic mask may comprise a first arrangement having a first radiation absorbing material having a first thickness, the first thickness determined as described above and the lithographic mask further comprises a second arrangement having a second radiation absorbing material having a second thickness, the first thickness and the second thickness being different.

The first arrangement may be a functional pattern and the second arrangement may be a measurement pattern.

The first radiation absorbing material may be the same material as the second radiation absorbing material.

The certain wavelength may be one of 193 nm, 365 nm, 248 nm, 157 nm or 126 nm.

According to a further aspect of the invention, there is provided a lithographic mask comprising a reflective substrate having a radiation absorbing material in an arrangement, the arrangement configured to apply a pattern to a cross-section of a radiation beam of a certain wavelength, wherein the absorbing material has a thickness which is substantially equal to or a multiple of the certain wavelength divided by twice a refractive index of the absorbing material, after taking an offset into account.

According to a further aspect of the invention, there is provided a method comprising providing a substrate, providing a beam of radiation with a certain wavelength using an illumination system, using a mask to impart the radiation beam with a pattern in its cross-section, and projecting the patterned radiation beam onto a target portion of the substrate, wherein the mask comprises a substrate which is transmissive to the radiation beam and to which a radiation absorbing material is provided in an arrangement, and wherein the thickness of the absorbing material is substantially equal to the radiation wavelength divided by a refractive index of the absorbing material.

According to a further aspect of the invention, there is provided a lithographic mask comprising a substrate which is substantially transmissive for radiation of a certain wavelength, the substrate having a radiation absorbing material in an arrangement, the arrangement configured to apply a pattern to a cross-section of a radiation beam of the certain wavelength, wherein the radiation absorbing material arrangement comprises a plurality of structures having a first pitch and a plurality of structures having a second pitch, and wherein the absorbing material has a thickness which is such that the structures having the first pitch and the structures having the second pitch will have substantially equal best focus planes when projected using a projection system of a lithographic apparatus.

According to a further aspect of the invention, there is provided a lithographic mask comprising a substrate which is substantially transmissive for radiation of a certain wavelength, the substrate having a radiation absorbing material in an arrangement, the arrangement configured to apply a pattern to a cross-section of a radiation beam of the certain wavelength, wherein the radiation absorbing material arrangement comprises a plurality of structures having a first pitch and a plurality of structures having a second pitch, and wherein the absorbing material has a thickness which is such that the structures having the first pitch and the structures having the second pitch will experience substantially equal image shifts when projected using a projection system of a lithographic apparatus. The image shifts are displacements of the images of the structures after imaging in a direction substantially perpendicular to the optical axis of the imaging system.

According to a further aspect of the invention, there is provided a lithographic mask comprising a reflective substrate having a radiation absorbing material in an arrangement, the arrangement configured to apply a pattern to a cross-section of a radiation beam having a certain wavelength, wherein the radiation absorbing material arrangement comprises a plurality of structures having a first pitch and a plurality of structures having a second pitch different compared to the first pitch, and wherein the absorbing material has a thickness which is such that a focus difference between the best focus plane for the structures having the first pitch and a best focus plane for the structures having the second pitch substantially corresponds to a minimum of a variation of the focus difference versus absorbing material thickness when projected using a projection system of a lithographic apparatus.

According to a further aspect of the invention, there is provided a lithographic mask comprising a reflective substrate having a radiation absorbing material in an arrangement, the arrangement configured to apply a pattern to a cross-section of a radiation beam of the certain wavelength, wherein the radiation absorbing material arrangement comprises a plurality of structures having a first pitch and a plurality of structures having a second pitch different compared to the first pitch, and wherein the absorbing material has a thickness which is such that an image shift difference between the image shift experienced by the structures having the first pitch and the image shift experienced by the structures having the second pitch substantially corresponds to a minimum of a variation of the image shift difference versus absorbing material thickness.

The first pitch, as measured after projection by the projection system of the lithographic apparatus, may be substantially half of the wavelength of the certain wavelength.

The first pitch, as measured after projection by the projection system of the lithographic apparatus, may be smaller than the certain wavelength and the second pitch, as measured after projection by the projection system of the lithographic apparatus, may be larger than the certain wavelength.

According to a further aspect of the invention, there is provided a blank mask comprising a substrate which substantially transmissive for radiation of a certain wavelength, the substrate having radiation absorbing material, the radiation absorbing material being etchable to generate a pattern in the radiation absorbing material, wherein a thickness of the radiation absorbing material is such that following etching the radiation absorbing material has a thickness which is substantially equal to the certain wavelength divided by a refractive index of the radiation absorbing material.

According to a further aspect of the invention, there is provided a blank mask comprising a reflective substrate provided with a radiation absorbing material, the radiation absorbing material being etchable to generate a pattern in the radiation absorbing material, wherein a thickness of the radiation absorbing material is such that following etching the radiation absorbing material has a thickness which substantially corresponds to a minimum of a variation of the focus difference versus absorbing material thickness when projected at a certain wavelength using a projection system of a lithographic apparatus.

A layer of a radiation sensitive resist may be provided over the radiation absorbing material.

According to a further aspect of the invention, there is provided a method of determining a thickness of a radiation absorbing material to be provided to a lithographic mask, the lithographic mask comprising a substrate which is substantially transmissive for radiation of a certain wavelength and the substrate comprising the radiation absorbing material arranged to form a plurality of structures for imaging via a projection system of a lithographic apparatus, the method comprising selecting a plurality of structures having different pitches, determining best focus planes of the selected structures when imaged via the projection system, the best focus planes being determined for different thicknesses of the radiation absorbing material, and selecting the thickness of the radiation absorbing material for which the plurality of structures have substantially equal best focus planes when imaged using the projection system.

According to a further aspect of the invention, there is provided a method of determining a thickness of a radiation absorbing material to be provided to a lithographic mask, the lithographic mask comprising a substrate which is substantially transmissive for radiation of a certain wavelength and the substrate comprising the radiation absorbing material arranged to form a plurality of structures for imaging via a projection system of a lithographic apparatus, the method comprising selecting a plurality of structures having different pitches, determining image shifts of the selected structures when imaged via the projection system, the image shifts being determined for different thicknesses of the radiation absorbing material, and selecting the thickness of the radiation absorbing material for which the plurality of structures have substantially equal image shifts when imaged using the projection system.

According to a further aspect of the invention there is provided a method of determining a thickness of a radiation absorbing material to be provided to a lithographic mask, the lithographic mask comprising a reflective substrate and the substrate comprising the radiation absorbing material arranged to form a plurality of structures for imaging using a projection system of a lithographic apparatus, the method comprising selecting a plurality of structures having different pitches, determining best focus planes of the selected structures when imaged via the projection system using a certain wavelength, the best focus planes being determined for different thicknesses of the radiation absorbing material, and selecting the thickness of the radiation absorbing material to be a thickness at which a variation, as a function of absorbing material thickness, of a difference between best focus planes of the selected structures substantially corresponds to a minimum when the structures are imaged using the projection system.

According to a further aspect of the invention there is provided a method of determining a thickness of a radiation absorbing material to be provided to a lithographic mask, the lithographic mask comprising a reflective substrate and the substrate comprising the radiation absorbing material arranged to form a plurality of structures for imaging using a projection system of a lithographic apparatus, the method comprising selecting a plurality of structures having different pitches, determining image shifts of the selected structures when imaged via the projection system using a certain wavelength, the image shifts being determined for different thicknesses of the radiation absorbing material, and selecting the thickness of the radiation absorbing material to be a thickness at which a variation, as a function of absorbing material thickness, of a difference between image shifts of the selected structures substantially corresponds to a minimum when the structures are imaged using the projection system.

The determining the best focus plane or the determining the image shift may be performed by simulating the projection of the structures using the projection system.

A first structure in the plurality of structures may comprise a first pitch, as measured after projection by the projection system, having a dimension of substantially half of the wavelength of the certain wavelength.

A first structure in the plurality of structures may comprise a pitch being smaller than the certain wavelength, and a second structure in the plurality of structures may comprise a pitch larger than the certain wavelength, the pitches being as measured after projection by the projection system.

The selecting the thickness may comprise defining a range within which the thickness is chosen.

The selecting the thickness may further comprise selecting the thickness of the absorbing material depending on a phase-shifting characteristic of the absorbing material to the radiation of the certain wavelength.

The thickness of the absorbing material may be further selected to optimize the phase-shifting characteristic of the absorbing material.

According to a further aspect of the invention, there is provided computer program product configured to perform the method according to any of the preceding aspects of the invention.

According to a further aspect of the invention, there is provided a lithographic apparatus comprising an illumination system to condition a beam of radiation, a support structure to support a mask, the mask serving to impart the radiation beam with a pattern in its cross-section, a substrate table to hold a substrate, and a projection system to project the patterned radiation beam onto a target portion of the substrate, wherein the lithographic apparatus further comprises a mask according to any preceding aspect of the invention.

The radiation beam may be a polarized radiation beam.

The polarized radiation beam may have at least two polarization states, an intensity in a first polarization state being different from an intensity in a second polarization state.

According to a further aspect of the invention, there is provided a method comprising providing a substrate, providing a beam of radiation with a certain wavelength using an illumination system, using a mask according to any preceding aspect of the invention to impart the radiation beam with a pattern in its cross-section, and projecting the patterned radiation beam onto a target portion of the substrate.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
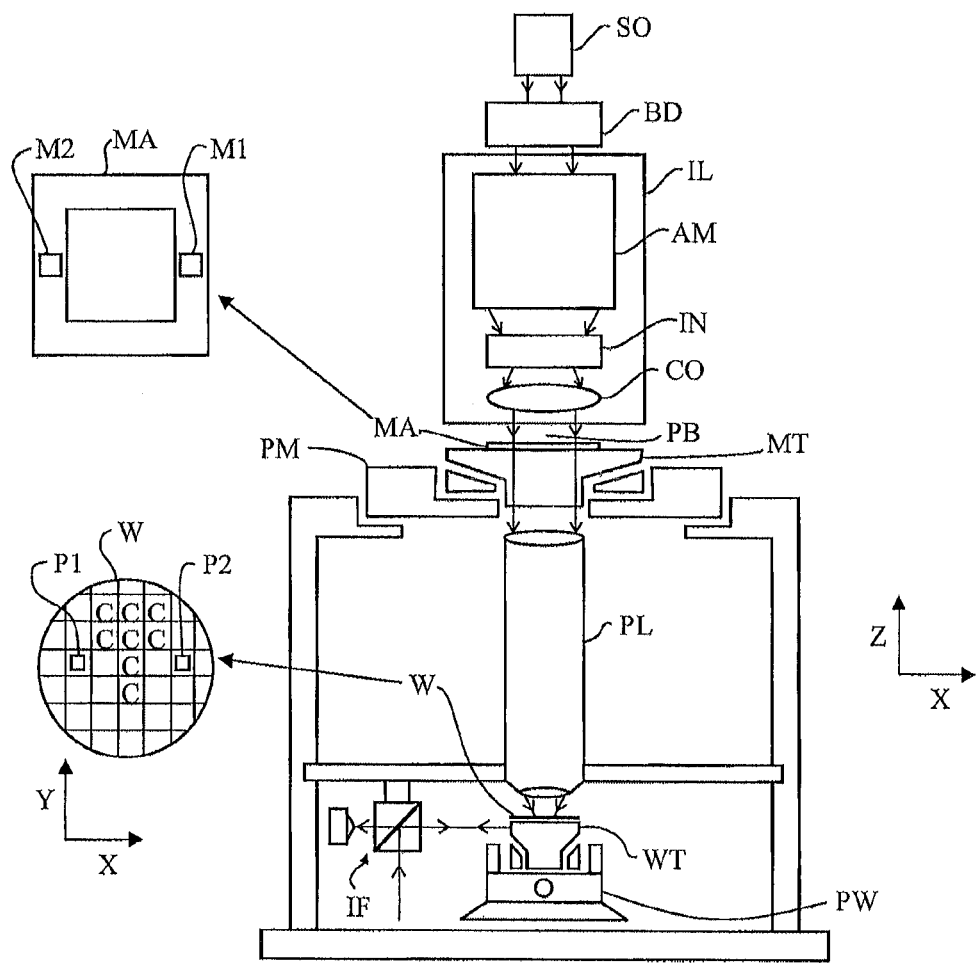
FIG. 1 schematically depicts a lithographic apparatus according to an embodiment of the invention.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5-20 nm, which may for example be 13.5 nm or 6.7 nm).

The support structure holds the mask (which may also be referred to as a reticle). It holds the mask in a way depending on the orientation of the mask, the design of the lithographic apparatus, and other conditions, such as for example whether or not the mask is held in a vacuum environment. The support can use mechanical clamping, vacuum, or other clamping techniques, for example electrostatic clamping under vacuum conditions. The support structure may be a frame or a table, for example, which may be fixed or movable as required and which may ensure that the mask is at a desired position, for example with respect to the projection system.

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "projection lens" herein may be considered as synonymous with the more general term "projection system".

The illumination system may also encompass various types of optical components, including refractive, reflective, and catadioptric optical components for directing, shaping, or controlling the beam of radiation, and such components may also be referred to below, collectively or singularly, as a "lens".

The lithographic apparatus may be of a type having two (dual stage) or more substrate tables (and/or two or more support structures). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion techniques are well known in the art for increasing the numerical aperture of projection systems.

FIG. 1 schematically depicts a lithographic apparatus according to a particular embodiment of the invention. The apparatus comprises:
  an illumination system (illuminator) IL to condition a beam PB of radiation (e.g. UV radiation).
  a support structure (e.g. a support structure) MT to support a mask MA and connected to a first positioning device PM to accurately position the mask with respect to item PL;
  a substrate table (e.g. a wafer table) WT to hold a substrate (e.g. a resist coated wafer) W and connected to a second positioning device PW to accurately position the substrate with respect to item PL; and
  a projection system (e.g. a refractive projection lens) PL configured to image a pattern imparted to the radiation beam PB by mask MA onto a target portion C (e.g. comprising one or more dies) of the substrate W.

As here depicted, the apparatus is of a transmissive type (e.g. employing a transmissive mask). Alternatively, the apparatus may be of a reflective type (e.g. employing a reflective mask).

The illuminator IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising for example suitable directing mirrors and/or a beam expander. In other cases the source may be integral part of the apparatus, for example when the source is a mercury lamp. The source SO and the illuminator IL, together with the beam delivery system BD if required, may be referred to as a radiation system.

The illuminator IL may comprise adjusting means AM for adjusting the angular intensity distribution of the beam. Generally, at least the outer and/or inner radial extent (commonly referred to as σ-outer and σ-inner, respectively) of the intensity distribution in a pupil plane of the illuminator can be adjusted. In addition, the illuminator IL generally comprises various other components, such as an integrator IN and a condenser CO. The illuminator provides a conditioned beam of radiation PB, having a desired uniformity and intensity distribution in its cross section.

The radiation beam PB is incident on the mask, which is held on the support structure MT. Having traversed the mask MA, the beam PB passes through the projection system PL, which focuses the beam onto a target portion C of the substrate W. With the aid of the second positioning device PW and position sensor IF (e.g. an interferometric device), the substrate table WT can be moved accurately, e.g. so as to position different target portions C in the path of the beam PB. Similarly, the first positioning device PM and another position sensor (which is not explicitly depicted in FIG. 1) can be used to accurately position the mask MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning device PM and PW. However, in the case of a stepper (as opposed to a scanner) the support structure MT may be connected to a short stroke actuator only, or may be fixed. Mask MA and substrate W may be aligned using mask alignment marks M1, M2 and substrate alignment marks P1, P2.

The depicted apparatus can be used in the following preferred modes:
1. In step mode, the support structure MT and the substrate table WT are kept essentially stationary, while an entire pattern imparted to the beam PB is projected onto a target portion C in one go (i.e. a single static exposure). The substrate table WT is then shifted in the X and/or Y direction so that a different target portion C can be exposed. In step mode, the maximum size of the exposure field limits the size of the target portion C imaged in a single static exposure.
2. In scan mode, the support structure MT and the substrate table WT are scanned synchronously while a pattern imparted to the beam PB is projected onto a target portion C (i.e. a single dynamic exposure). The velocity and direction of the substrate table WT relative to the support structure MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

Combinations and/or variations on the above described modes of use or entirely different modes of use may also be employed.

When imaging a pattern from the mask MA onto the substrate W using a lithographic apparatus it may be desirable to position the substrate such that a focussed image of the mask is formed on the substrate. However, the topography of the surface of the mask may introduce a phase difference into the radiation when it is patterned by the mask (the height of the surface of the mask may, for example, vary by around 2-3 nanometers). The effect of such a phase difference may be that the best focus for an image of a first type of feature (e.g. dense lines) lies in a first plane and the best focus for an image of a second type of feature (e.g. isolated lines) lies in a second plane which is different from the first plane. Thus, it may not be possible to position the substrate at a plane in which the best focus is achieved for both the first and second types of features. This problem may be referred to as focus difference. The focus difference may be considered to be the separation between the first plane and the second plane. Focus difference may also occur between pattern features having a first pitch and pattern features having a second pitch. Focus difference caused by the topography of the surface of the mask may be referred to as a 3D mask effect.

The term "best focus" may be interpreted as meaning the plane in which the best contrast of an aerial image is seen. In some instances the best focus may be measured by measuring the aerial image directly (e.g. using a sensor). In some instances the best focus may be measured by imaging a pattern onto a substrate a plurality of times, the substrate being positioned in a different plane each time the pattern is imaged onto it. A critical dimension of the pattern may be measured for each image of the pattern, and this may be plotted as a function of substrate plane position in order to generate a Bossung curve. A maximum or minimum of the Bossung curve may be taken as indicating the best focus of the pattern.

Figure 2:
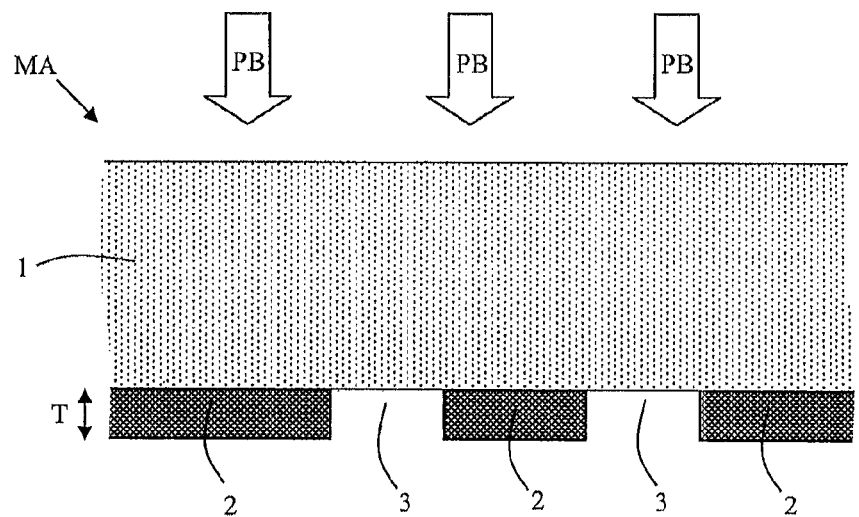
FIG. 2 schematically depicts part of a lithographic mask according to an embodiment of the invention.

FIG. 2 schematically shows in cross section part of a mask MA according to an embodiment of the invention. The mask MA comprises a substrate 1 and an absorbing material 2. The substrate 1 may be, for example, formed from glass or any other suitable material which is substantially transparent to the radiation beam PB of the lithographic apparatus (e.g. DUV radiation). The absorbing material 2 may be, for example, molybdenum silicide (MoSi) or any other suitable material which absorbs the radiation beam PB of the lithographic apparatus (e.g. DUV radiation) or which absorbs part of the radiation beam PB. The MoSi may be provided with one or more dopants which may modify the refractive index of the MoSi. The absorbing material 2 does not fully cover the substrate 1, but instead is configured as an arrangement, i.e., pattern. Thus, gaps 3 are present between areas of absorbing material 2. Only a small part of the mask MA is shown in FIG. 2. In practice the absorbing material 2 and gaps 3 are arranged to form an arrangement which may for example have thousands or millions of features.

The radiation beam PB of the lithographic apparatus (see FIG. 1) is incident upon the mask MA. The radiation beam PB is initially incident upon the substrate 1 and passes through the substrate 1. The radiation beam is then incident upon the absorbing material 2 and gaps 3. Radiation which is incident upon the absorbing material 2 passes through the absorbing material but is partially absorbed by the absorbing material. Alternatively, the radiation is substantially fully absorbed in the absorbing material 2 and substantially no radiation is transmitted through the absorbing material 2. Radiation which is incident upon the gaps 3 passes through the gaps without being significantly or partially absorbed. The mask MA thus applies a pattern to the radiation beam PB (which pattern may be applied to an unpatterned radiation beam PB or applied to a radiation beam PB already having a pattern).

The thickness T of the absorbing material 2 is substantially equal to the wavelength of the radiation beam PB as it travels through the absorbing material (i.e., taking into account the refractive index of the absorbing material). In an embodiment the wavelength of the radiation beam PB may be 193 nanometers. Thus, the thickness of the absorbing material 2 in nanometers may be 193/n, where n is the refractive index of the absorbing material 193 nanometers is a widely used radiation wavelength in lithographic apparatus. It is conventionally used in immersion lithography apparatus, i.e., apparatus in which a fluid such as water is located between the projection system PS of the lithographic apparatus and the substrate W. The fluid can provide the projection system with a numerical aperture greater than 1.0 (e.g. 1.35 NA). When such a high numerical aperture is used, the topography of a mask MA (i.e. unevenness across the surface of the mask) may introduce an unwanted phase offset into the patterned radiation, and such a phase offset may cause focus difference. The focus difference may reduce the accuracy with which a pattern is projected onto a substrate by the lithographic apparatus. The focus difference is reduced or eliminated when the thickness of the absorbing material 2 is equal to the wavelength of the radiation beam as it travels through the absorbing material. This may provide a significant improvement of the accuracy with which the lithographic apparatus may project a pattern onto a substrate.

It is not necessary for the radiation to travel through the absorber material 2, and for some absorber materials 2 substantially all radiation may be absorbed in the absorber material 2. Without being held to any particular theory, it is believed that the thickness of the absorbing material 2 generates some kind of waveguides in the gaps 3. The dimensions of these waveguides seem to determine whether there are focus differences or image shift differences (explained further below) related to the pitches of a pattern on a mask. As such it seems of minor importance whether or not the absorber material 2 transmits any impinging radiation.

It has been the general belief in the lithographic industry that unwanted phase offsets caused by mask topography, and focus difference caused by those phase offsets, would reduce in size as the thickness of the absorbing material on the mask was reduced. This arose from the understanding that the size of unwanted phase offsets increased as the size of the mask topography variations increased, and that reduced mask topography variation was best achieved through using a thinner layer of absorbing material. However, surprisingly, this is not the case. Instead, the phase offsets caused by mask topography increase as the thickness of the absorbing material is reduced (if the absorbing material is thinner than the wavelength of the radiation beam, as is the case in conventional masks). Furthermore, surprisingly, unwanted phase offsets tend towards a minimum (which may be zero) as the thickness of the absorbing material tends towards the wavelength of the radiation beam in the absorbing material. Correspondingly, the focus difference also tends towards a minimum (which may be zero) as the thickness of the absorbing material tends towards the wavelength of the radiation beam in the absorbing material. Hence, in an embodiment of the invention, a mask is provided which has absorbing material 2 having a thickness which corresponds with the wavelength of the radiation beam PB in the absorbing material.

Figure 3:
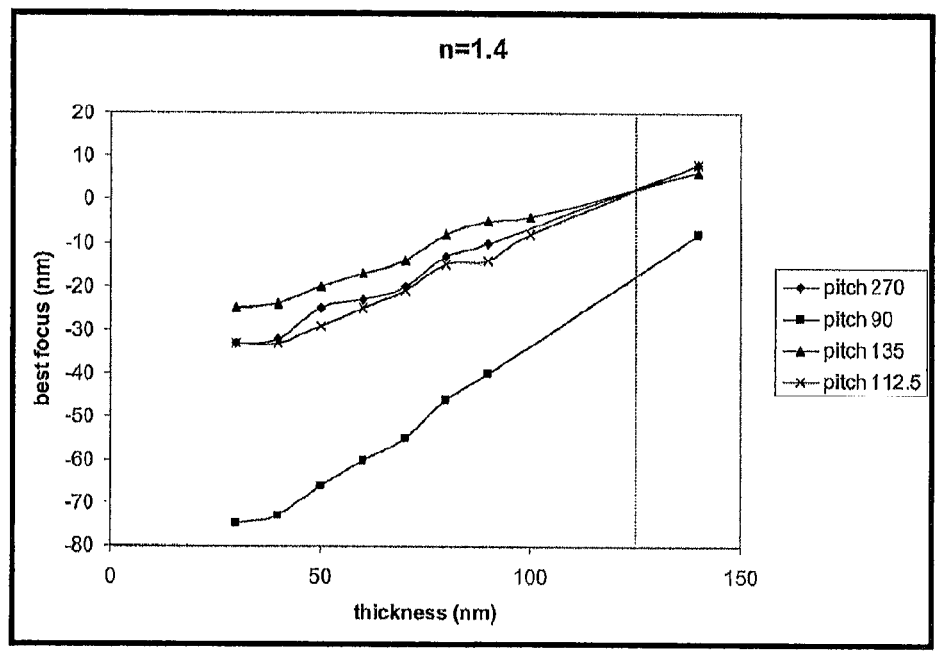
FIG. 3 is a graph which shows the results of a simulation which models the best focus of a lithographic apparatus as a function of the thickness of absorbing material on a mask used by the lithographic apparatus.

FIG. 3 is a graph which shows the results of a simulation which measures how the best focus of a lithographic apparatus changes as a function of the thickness of the absorbing material of a mask. The term 'best focus' may be interpreted as meaning the plane in which an aerial image with the best contrast is obtained. The simulation modelled the projection of structures by a lithographic apparatus, and was performed using Hyperlith software, which is available from Panoramic Technology, Inc (www.panoramictech.com). The projection of structures onto a range of different planes by the lithographic apparatus was simulated. The variation of the critical dimension of those projected structures was then determined as a function of the plane position in order to generate Bossung curves. For a given structure, a maximum or minimum of the Bossung curve was taken as indicating the best focus of that structure. The simulation was repeated for different thicknesses of mask absorbing material.

The simulation used a radiation wavelength of 193 nanometers and an absorbing material refractive index of 1.4. Both axes of the graph indicate units measured in nanometers. Due to the nature of the simulation, the zero point on the best focus axis is at an arbitrary location. The simulation was performed for patterns having four different pitches, namely 270 nanometers, 135 nanometers, 112.5 nanometers and 90 nanometers. The pitch dimensions are the pitches at the substrate side of the projection system PS (see FIG. 1) of the lithographic apparatus as is conventional. In contrast to this, the absorbing material thickness indicated on the horizontal axis of the graph is measured on the mask side of the projection system PS.

As may be seen from FIG. 3, the best focus for patterns having pitches of 270 nanometers, 135 nanometers and 112.5 nanometers all intersect with each other when the absorbing material has a particular thickness (the intersection is marked by a dotted vertical line). This intersection indicates that the focus difference for those three pitches is zero when the absorbing material has that thickness. The absorbing material thickness at which the intersection occurs is approximately 130 nanometers. The wavelength of radiation passing through the absorbing material is 138 nanometers ($=193/1.4$). The thickness of the absorbing material which provides a minimized focus difference is thus well within 10% of the radiation wavelength, and may be considered to be substantially equal to the radiation wavelength. At least some of the difference may arise due to limitations of the simulation. These may include uncertainty when extracting the best focus from a set of measurements. Using curve fitting to fit curves to sets of results may improve the extent to which the results of the simulation correspond with the thickness as calculated using the radiation wavelength and the refractive index of the absorbing material.

The 90 nanometer pitch pattern behaves slightly differently to the other pitches. As the thickness of the absorbing material increases, the best focus for the 90 nanometer pitch draws closer to the best focus for other pitches. However, the best focus does not intersect with the other best focuses, thus indicating that a focus difference remains. The reason why the 90 nanometer pitch line does not intersect with other pitch lines is not understood, but it may arise from limitations of the simulation used to generate the graph.

Figure 4:
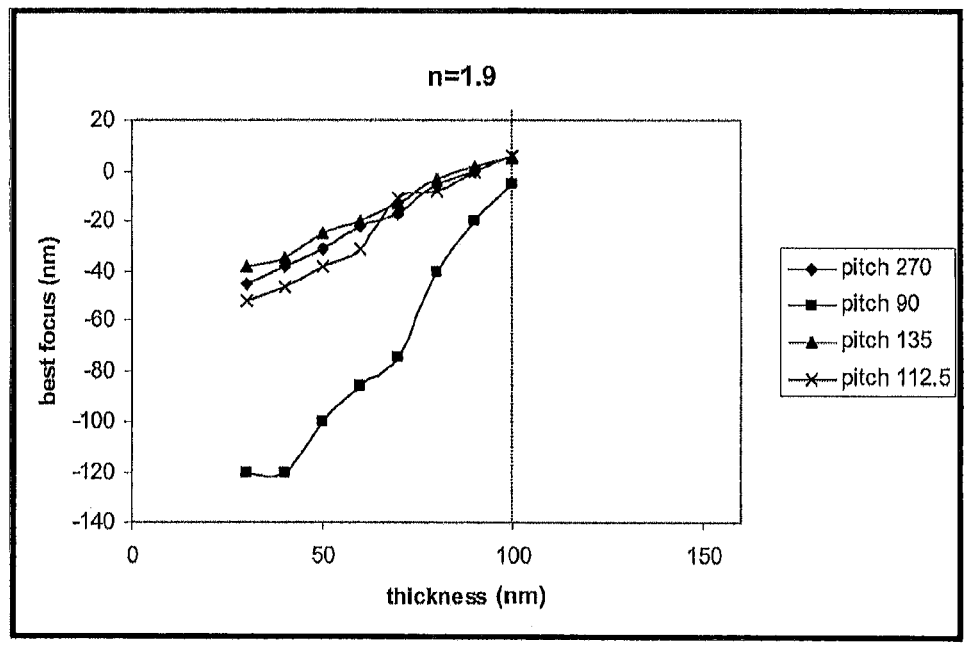
FIG. 4 is a graph which corresponds with the graph of FIG. 3 but which simulates the effect of using a different absorbing material.

FIG. 4 is a graph which shows the results of a simulation which corresponds with the simulation used to generate FIG. 3, except that the absorbing material had a refractive index of 1.9 rather than 1.4. As may be seen from FIG. 4, the focus difference behaves in the same manner as a function of absorbing material thickness. That is, the focus difference reduces as the thickness of the absorbing material increases, and the focus difference passes through a minimum where the lines for pitches of 270 nanometers, 135 nanometers and 112.5 nanometers intersect with each other (the intersection is marked by a dotted vertical line). This occurs when the absorbing material has a thickness of approximately 100 nanometers. The wavelength of radiation passing through the absorbing material is 102 nanometers ($=193/1.9$). The thickness of the absorbing material which provides a minimized focus difference is thus well within 10% of the radiation wavelength, and may be considered to be substantially equal to the radiation wavelength. Again, using curve fitting to fit curves to sets of results may improve the extent to which the results of the simulation correspond with the thickness as calculated using the radiation wavelength and the refractive index of the absorbing material.

The 90 nanometer pitch pattern again behaves slightly differently to the other pitches. The focus difference reduces as the thickness of the absorbing material increases, but does not intersect with the focus differences measured for other pitches. The reason for this is not understood, but it may be due to limitations of the simulation used to generate the graph.

Figure 5:
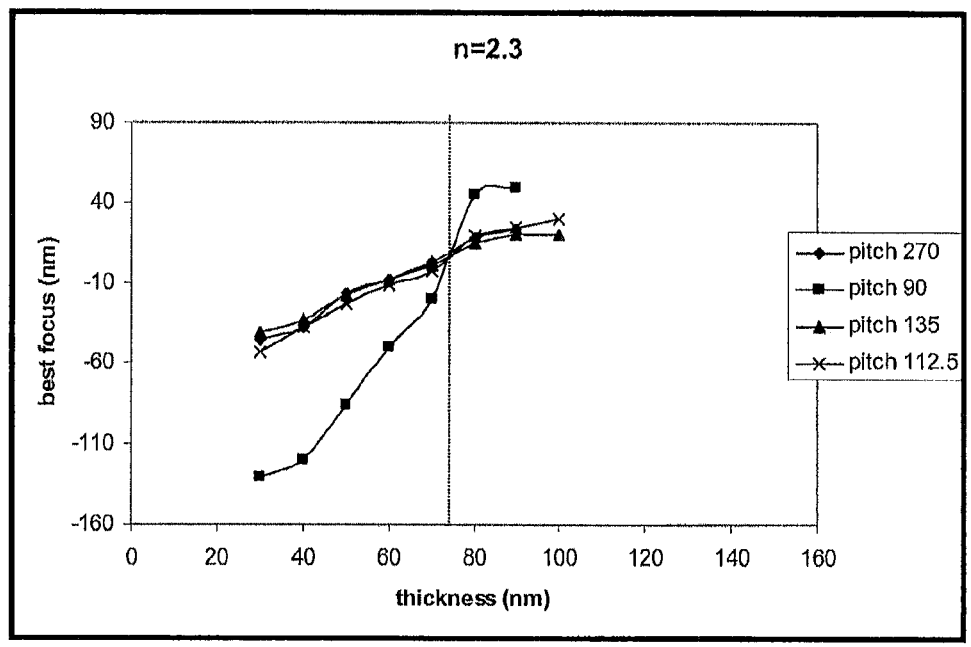
FIG. 5 is a graph which corresponds with the graphs of FIG. 3 and FIG. 4 but which simulates the effect of using a different absorbing material.

FIG. 5 shows the results of another simulation which corresponds with the previous simulations except that the refractive index of the absorbing material was 2.3. Similar results are seen, with the focus difference reducing as the thickness of the absorbing material is increased. In this simulation, an intersection occurs for all pitches (i.e. including 90 nanometers). The focus difference is minimized when the absorbing material has a thickness of approximately 75 nanometers (the intersection is marked by a dotted vertical line). The wavelength of radiation passing through the absorbing material is 84 nanometers ($=193/2.3$). The thickness of the absorbing material which provides a minimized focus difference is within approximately 10% of the radiation wavelength, and may be considered to be substantially equal to the radiation wavelength. At least some of the difference may arise due to limitations of the simulation. Furthermore, using curve fitting to fit curves to sets of results may improve the extent to which the results of the simulation correspond with the thickness as calculated using the radiation wavelength and the refractive index of the absorbing material.

The mask absorbing material thicknesses which provide reduced focus difference (e.g. minimized focus difference, e.g. zero focus difference) are markedly different from conventionally used mask absorbing material thicknesses. For example, an absorbing material with a refractive index of 1.4 would conventionally be provided with a thickness of around 43 nanometers on a mask. For example, an absorbing material with a refractive index of 1.9 would conventionally be provided with a thickness of around 50 nanometers on a mask. However, both of these thicknesses may give rise to considerable topography induced focus difference, as has been demonstrated by the simulation results shown in FIGS.

3 and 4. The topography induced focus difference may be reduced by providing the absorbing material with a significantly increased thickness compared with a conventionally provided thickness.

In the above described embodiments, the topography induced focus differences are reduced by increasing the thickness of the absorbing material beyond the conventional thickness. Additionally or alternatively, dopant may be added to the absorbing material which increases its refractive index. Similarly, the refractive index of the absorbing material may be modified by changing the relative proportions of molybdenum and silicide in the absorbing material. Any combination of these approaches may be used.

In the above described embodiments, the absorbing material is a single material. However, the absorbing material may be more than one material. The materials may, for example, be provided as layers, and may, for example, be provided as a stack of alternating layers. Simulation has shown that if the absorbing material is more than one material, then the thickness of the material which will give the best focus difference (e.g. a zero or minimum focus difference) may be determined using the average refractive index of the absorbing material. The average of the refractive index takes into account the proportions of the different materials through which the radiation beam passes. For example, if half of the thickness of the absorbing material is material having a refractive index of 1.4 and half of the thickness of the absorbing material is material having a refractive index of 2.4, then the refractive index of the absorbing material may be treated as being $(1.4+2.4)/2=1.9$. The refractive index 1.9 may be used to determine the thickness of absorbing material that should be provided in this case. For example, if two thirds of the thickness of the absorbing material is material having a refractive index of 1.4 and one third of the thickness of the absorbing material is material having a refractive index of 2.4, then the refractive index of the absorbing material may be treated as being $[(1.4\times2)+2.4)]/3=1.7$.

Figure 6:
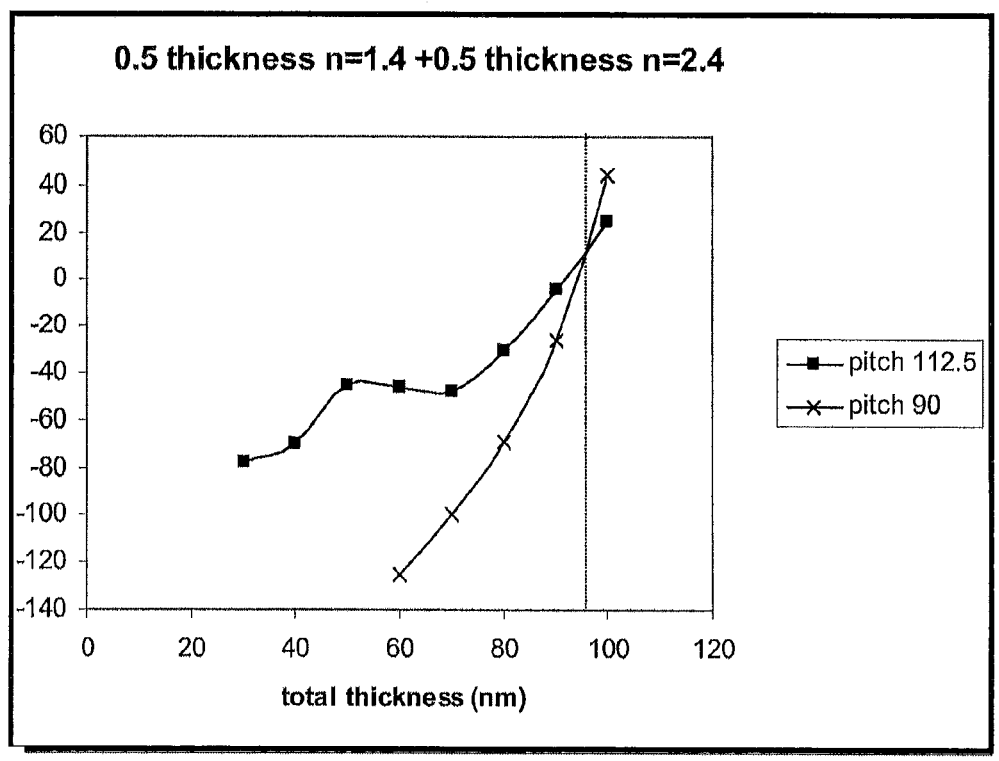
FIG. 6 is a graph which corresponds with the graphs of FIGS. 3-5 but which simulates the effect of using two absorbing materials provided in layers.

FIG. 6 shows the results of a simulation which corresponds with previously described simulations, except that half of the thickness of the absorbing material has a refractive index of 1.4 and half of the thickness of the absorbing material has a refractive index of 2.4. As may be seen, the focus difference reduces as the thickness of the absorbing material increases, and the focus difference passes through a minimum where the lines for pitches of 112.5 nanometers and 90 nanometers intersect with each other (the intersection is marked by a dotted vertical line). This occurs when the absorbing material has a thickness of approximately 95 nanometers. The wavelength of radiation passing through the absorbing material is 102 nanometers (=193/1.9). The thickness of the absorbing material which provides a minimized focus difference is thus well within 10% of the radiation wavelength, and may be considered to be substantially equal to the radiation wavelength.

The simulation of FIG. 6 used a single layer of material with a refractive index of 1.4 and a single layer of material with a refractive index of 2.4. However, the average refractive index of the absorbing material may be used to determine the thickness of absorbing material that should be provided, irrespective of the number of layers of material which are used to form the absorbing material. The average refractive index may, for example, be used even if a stack of alternating layers of two materials is used to form the absorbing material (or a stack comprising more than two materials).

The above described embodiments of the invention have been directed towards reducing or eliminating focus difference. Focus difference arises when a radiation beam of a lithographic apparatus suffers even order aberrations (e.g. caused by the topography of the mask). When a radiation beam of a lithographic apparatus suffers odd order aberrations, a pattern image may move in a direction transverse to an optical axis of the lithographic apparatus. This may be referred to as image shift. Image shift for an image of a first type of feature (e.g. dense lines) may be different to image shift for an image of a second type of feature (e.g. isolated lines) lines. Embodiments of the invention may reduce the difference between image shifts for different types of features (or features having different pitches) in the same way that they reduce focus difference. That is, image shift may be reduced by providing the absorbing material with a thickness which reduces or eliminates unwanted phase offset. Image shift may be reduced by providing the absorbing material with a thickness which is substantially equal to the wavelength of the radiation beam in the absorbing material. Image shift may be reduced by providing the absorbing material with a thickness which is within 10% of the wavelength of the radiation beam in the absorbing material. Image shift may be reduced by providing the absorbing material with a thickness which is within 20% of the wavelength of the radiation beam in the absorbing material.

In an embodiment, the mask may be created by etching a pattern into a mask blank. When etching the pattern into the mask blank, regions of the radiation absorbing material which are not etched through to the substrate may nevertheless be made thinner by the etching. This thinning may be taken into account when determining what thickness of radiation absorbing material to provide on the mask blank. The mask blank may be provided with a layer of radiation absorbing material which has a thickness that is such that, after etching, the thickness of the radiation absorbing material is substantially equal to the certain wavelength divided by a refractive index of the radiation absorbing material. Calculation of the thickness of radiation absorbing material to provide on the mask blank may take properties of the etching into account (e.g. the duration of the etching).

In an embodiment, a mask may be provided with a functional pattern (i.e. a pattern which will form part of an operational device) and may in addition be provided with a measurement pattern which does not form part of the functional pattern. The measurement pattern may be, for example, located to one side of the functional pattern. The measurement pattern may be used, for example, to measure alignment of the mask relative to the substrate table WT (see FIG. 1) of the lithographic apparatus, or may be used to measure some other parameter. The absorbing material which is used to form the measurement pattern may be different from the absorbing material which is used to form the functional pattern. For example, the absorbing material of the measurement pattern may a material which provides substantially complete absorption of the radiation beam. The absorbing material which is used to form the measurement pattern may be provided with a different thickness than the absorbing material used to form the functional pattern. The thickness of the absorbing material which is used to form the measurement pattern may be determined using an embodiment of the invention.

The extent to which the radiation beam PB is absorbed by the absorbing material may be different for different masks. For example, the radiation beam PB may be partially absorbed as it travels through the absorbing material. Alternatively, the radiation beam PB may be substantially fully absorbed as it passes through the absorbing material, i.e. the absorbing material blocks the radiation beam. A mask which has absorbing material that blocks the radiation beam may be referred to as a binary mask.

In embodiments in which the radiation beam is partially absorbed by the absorbing material of a mask, the phase of the radiation beam as it exits the absorbing material may affect the contrast of an aerial image formed using the mask. The contrast may, for example, be at a maximum if the phase of radiation which has passed through the absorbing material is 90° different from the phase of radiation which has not passed through the absorbing material. Since the phase of the radiation depends upon the thickness of the absorbing material, selecting an absorbing material thickness using the approach described above may reduce the contrast of the aerial image formed using the mask. In some application areas this may not be a significant concern. For example, if the lithographic apparatus is being used to image patterns which will form logic circuits then contrast may be considered to be less important than focus difference. The benefit provided by an improvement of focus difference (e.g. better critical density uniformity) may be considered to outweigh the reduced contrast.

In an embodiment, the phase shift provided by the mask, and the contrast that this provides, may be taken into account as well as the mask topography induced focus difference when selecting an absorbing material thickness. A compromise may be found which provides a necessary degree of contrast while providing a reduced mask topography induced focus difference and/or image shift (e.g. compared with a conventional thickness of absorbing material).

In an embodiment, an antireflection layer may be provided on top of the absorbing material. The antireflection layer may, for example, have a thickness of around 2 nanometers. The antireflection layer is not considered to form part of the absorbing material, and has therefore not been included when values of the thickness of the absorbing material have been stated. In general, a material which is significantly absorbing of the radiation beam may be taken into account when determining the thickness of the absorbing material.

In an embodiment, the thickness of the absorbing material which provides a minimized focus difference may be within 20% of the radiation wavelength. This may provide a significant reduction of focus difference and/or image shift compared with providing the absorbing material with a conventional thickness.

Although embodiments of the invention have been described in relation to a transmissive mask (i.e. a mask which transmits radiation), an embodiment of the invention may be applied to a reflective mask (i.e. a mask which reflects radiation); In an embodiment in which the mask is a reflective mask, the mask may be arranged such that the radiation beam is incident upon absorbing material and gaps, and then passes through these to be incident upon a reflector located behind the absorbing material and gaps. In an embodiment in which the mask is a reflective mask, the absorbing material has a thickness which is substantially equal to or a multiple of the certain wavelength divided by twice a refractive index of the absorbing material, after taking an offset into account.

Figure 7:
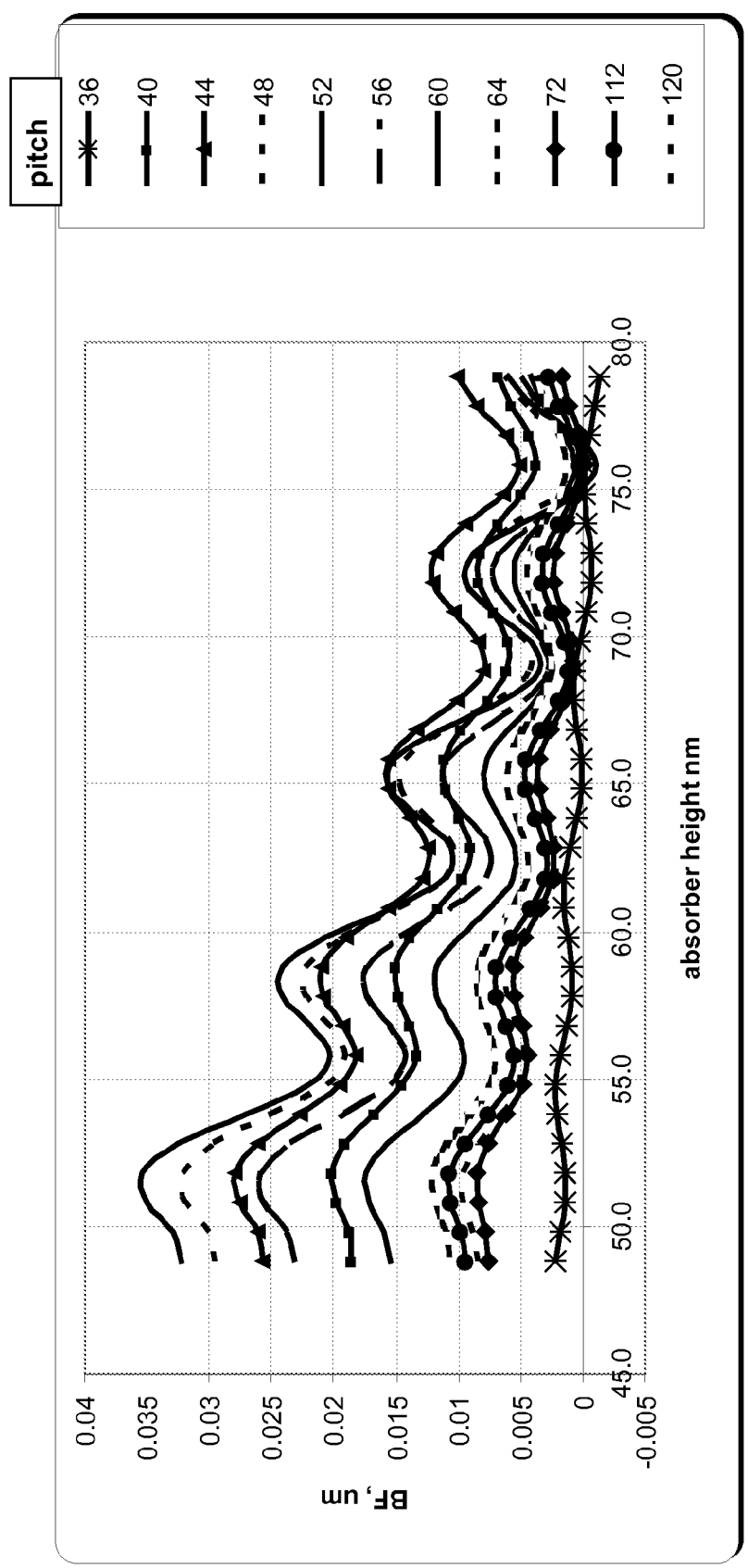
FIG. 7 is a graph which shows the results of a simulation which models the best focus of a lithographic apparatus as a function of the thickness of absorbing material of a reflective mask according to an embodiment of the invention.

FIG. 7 is a graph which shows the results of a simulation which measures how the best focus of a lithographic apparatus changes as a function of the thickness of the absorbing material of a reflective mask. The simulation was performed using Hyperlith software in the manner described further above. The simulation used a radiation wavelength of 13.5 nanometers. The refractive index of the absorbing material was approximately 9.5. The vertical axis of the graph shows the best focus and indicates units measured in microns. Due to the nature of the simulation, the zero point on the best focus axis is at an arbitrary location. The horizontal axis of the graph shows the thickness (expressed as height) of the absorbing material, and indicates units measured in nanometers. The simulation was performed for patterns having a range of different pitches which extended from a minimum of 36 nanometers to a maximum of 120 nanometers. The pitch dimensions are the pitches at the substrate side of the projection system of the lithographic apparatus as is conventional. The absorbing material thickness is measured on the mask side of the projection system PS.

Figure 8:
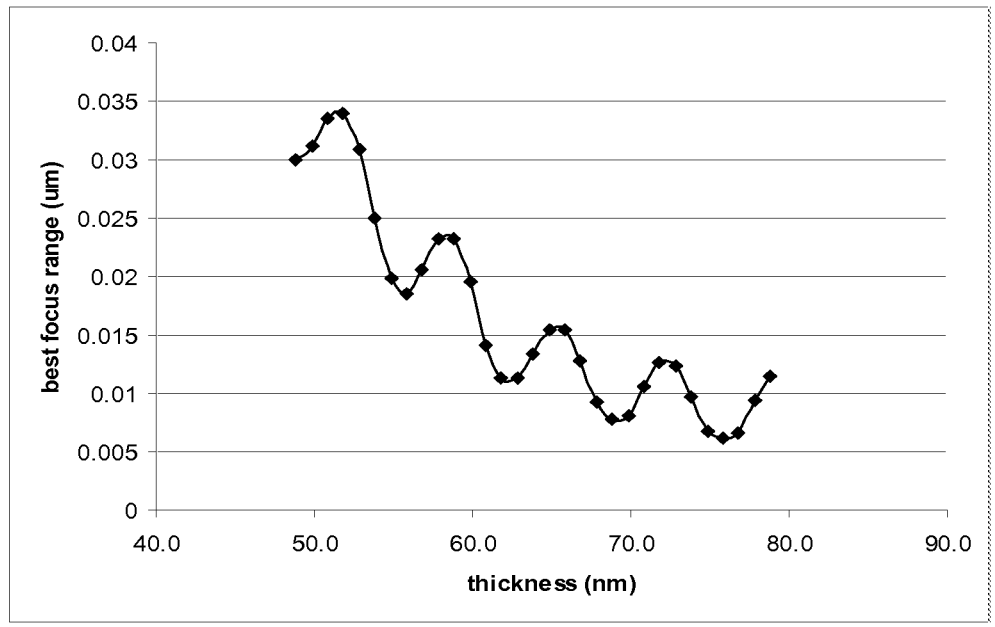
FIG. 8 is a graph which shows how the range of best focuses varies as a function of the thickness of the absorbing material.

As may be seen from FIG. 7, the difference between the best focuses for different pitches (the best focus range) increases and decreases in a periodic manner. In addition, there is a general trend towards a reduced best focus difference as the thickness of the absorbing material is increased. FIG. 8 is a graph which shows how the best focus range varies as a function of absorbing material thickness. FIG. 8 confirms that the best focus range increases and decreases in a periodic manner and trends towards a reduced best focus difference as the thickness of the absorbing material increases.

The period of the best focus range variation is approximately 7 nanometers. Thus, the focus range passes through a minimum for approximately every 7 nanometers of thickness of the absorbing material. However, the results of the simulation also include an offset, which may need to be taken into account in order to determine a thickness of absorbing material that provides a focus range minimum. In this example the offset is estimated at around 1-2 nanometers, but may have some other value. The offset may arise in part because the radiation beam is not perpendicularly incident upon the mask but instead has an angle of incidence of, for example, 6°. The offset may change as the angle of incidence of the radiation beam on the mask is changed. The offset may arise in part because the radiation beam is not reflected from a single reflective surface of the mask, but instead is reflected from a multilayer structure and penetrates into the multilayer structure.

Figure 9:
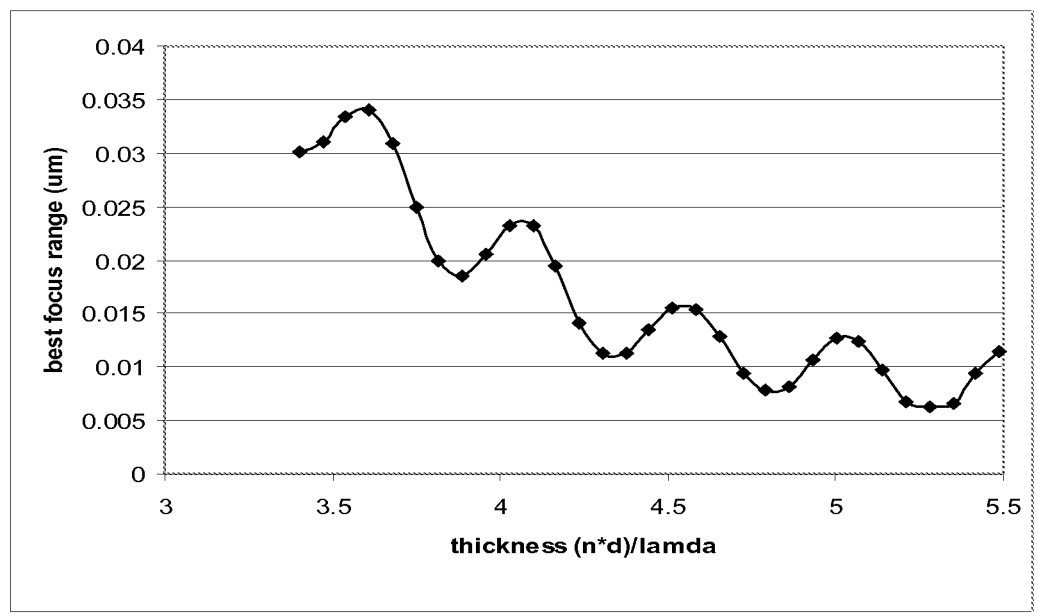
FIG. 9 is a graph which corresponds with the graph shown in FIG. 8 but in which the results of the simulation have been divided by the wavelength of the radiation and multiplied by the refractive index of the absorbing material.

FIG. 9 shows the data of FIG. 8 divided by the wavelength of the radiation and multiplied by the refractive index of the absorbing material. As can be seen from FIG. 9, the period of the best focus range is 0.5, and there is an offset of around 0.1. The period of 0.5 confirms that there are two absorbing material thicknesses for each wavelength of the radiation in the absorbing material which will provide a best focus minimum.

Although the above relates to minimising the best focus range via selection of the absorbing material thickness, a corresponding approach may be used to minimise image shift difference via selection of the absorbing material thickness.

It may be advantageous to use embodiments of the invention when the radiation beam PB is polarized. If the radiation beam is not polarized then the different polarizations which make up the radiation beam may cancel out the mask topography induced focus difference such that significant mask topography induced focus difference is not seen. If the radiation beam is polarized then this cancelling out will not occur, and an embodiment of the invention may be used to reduce mask topography induced focus difference. Polarized radiation is conventionally used in immersion lithography, and embodiments of the invention may therefore be advantageously used for immersion lithography. The radiation beam of an EUV lithographic apparatus may have a main angle, for example, of around 6°, and as a result different polarisation states provide different contributions to the radiation beam. Consequently, the reflected beam is different for the two polarization directions and as such can be considered to be polarized (at least to some extent). Embodiments of the invention may therefore be advantageously used for EUV lithography.

Although embodiments of the invention have been described in relation to radiation of 193 nanometers, an embodiment of the invention may be used in connection with other wavelengths. These may include for example other ultraviolet (UV) radiation (e.g. having a wavelength of 365, 248, 157 or 126 nm) and/or extreme ultra-violet (EUV) radiation (e.g. having a wavelength in the range of 5-20 nm). Similarly, although embodiments of the invention have been described in connection with immersion lithography, an embodiment of the invention may be used in connection with any form of projection lithography (e.g. non-immersion lithography).

The mask shown in FIGS. 1 and 2 may be referred to as a lithographic mask. The term 'lithographic mask' may be interpreted as meaning a mask which is suitable for use in a lithographic apparatus.

While specific embodiments of the invention have been described above, it will be appreciated that the invention may be practiced otherwise than as described. The description is not intended to limit the invention. For example, the embodiments of the invention may take the form of a computer program containing one or more sequences of machine-readable instructions describing a method as disclosed above, or a data storage medium (e.g. semiconductor memory, magnetic or optical disk) having such a computer program stored therein. Further, the machine-readable instruction may be embodied in two or more computer programs. The two or more computer programs may be stored on one or more different memories and/or data storage media.

The invention may further be described using the following clauses:

1. A lithographic mask comprising a substrate which is substantially transmissive for radiation of a certain wavelength, the substrate having a radiation absorbing material in an arrangement configured to apply a pattern to a cross-section of a radiation beam of the certain wavelength, wherein the absorbing material has a thickness which is substantially equal to the certain wavelength divided by a refractive index of the absorbing material.

2. A lithographic mask comprising a substrate which is substantially transmissive for radiation of a certain wavelength, the substrate having a radiation absorbing material in an arrangement, the arrangement configured to apply a pattern to a cross-section of a radiation beam of the certain wavelength, wherein the absorbing material has a thickness equal to or within a first range of 10% of the radiation wavelength divided by a refractive index of the absorbing material.

3. A lithographic mask comprising a substrate which is substantially transmissive for radiation of a certain wavelength, the substrate having a radiation absorbing material in an arrangement, the arrangement configured to apply a pattern to a cross-section of a radiation beam of the certain wavelength, wherein the absorbing material has a thickness equal to or within a second range of 20% of the radiation wavelength divided by a refractive index of the absorbing material.

4. The lithographic mask according to clause 2 or clause 3, wherein the thickness of the absorbing material within the first range or the second range is further chosen depending on a phase shift characteristic and resulting image contrast provided by the absorbing material to radiation of the certain wavelength.

5. The lithographic mask according to clause 4, wherein the thickness of the absorbing material is chosen to optimize the phase shift characteristic and resulting image contrast provided by the absorbing material to radiation of the certain wavelength.

6. The lithographic mask according to any of the previous clauses, wherein the absorbing material comprises a plurality of material layers having different refractive indices, and wherein the refractive index of the absorbing material is taken as being the average of the refractive indices of the material layers, the average taking into account the proportions of the different materials through which the radiation beam passes.

7. The lithographic mask according to any of the previous clauses, wherein the lithographic mask comprises a first arrangement having a first radiation absorbing material having a first thickness, the first thickness being determined according to any of the previous clauses and the lithographic mask further comprises a second arrangement having a second radiation absorbing material having a second thickness, the first thickness and the second thickness being different.

8. The lithographic mask according to clause 7, wherein the first arrangement is a functional pattern and the second arrangement is a measurement pattern.

9. The lithographic mask of clause 6 or clause 7, wherein the first radiation absorbing material is the same material as the second radiation absorbing material.

10. The lithographic mask of any preceding clause, wherein the certain wavelength is one of 193 nm, 365 nm, 248 nm, 157 nm or 126 nm.

11. A lithographic mask comprising a reflective substrate having a radiation absorbing material in an arrangement, the arrangement configured to apply a pattern to a cross-section of a radiation beam of a certain wavelength, wherein the absorbing material has a thickness which is substantially equal to or a multiple of the certain wavelength divided by twice a refractive index of the absorbing material, after taking an offset into account.

12. A method comprising:
    providing a beam of radiation with a certain wavelength using an illumination system;
    using a mask to impart the radiation beam with a pattern in its cross-section; and
    projecting the patterned radiation beam onto a target portion of a substrate,
    wherein the mask comprises a substrate transmissive to the radiation beam and the substrate has a radiation absorbing material provided in an arrangement, and wherein the thickness of the absorbing material is substantially equal to the radiation wavelength divided by a refractive index of the absorbing material.

13. A lithographic mask comprising a substrate substantially transmissive for radiation of a certain wavelength, the substrate having a radiation absorbing material in an arrangement, the arrangement configured to apply a pattern to a cross-section of a radiation beam of the certain wavelength, wherein the radiation absorbing material arrangement comprises a plurality of structures having a first pitch and a plurality of structures having a second pitch different compared to the first pitch, and wherein the absorbing material has a thickness which is such that the structures having the first pitch and the structures having the second pitch will have substantially equal best focus planes when projected using a projection system of a lithographic apparatus.

14. A lithographic mask comprising a substrate substantially transmissive for radiation of a certain wavelength, the substrate having a radiation absorbing material in an arrangement, the arrangement configured to apply a pattern to a cross-section of a radiation beam of the certain wavelength, wherein the radiation absorbing material arrangement comprises a plurality of structures having a first pitch and a plurality of structures having a second pitch different compared to the first pitch, and wherein the absorbing material has a thickness which is such that the structures having the first pitch and the structures having the second pitch will experience substantially equal image shifts when projected using a projection system of a lithographic apparatus.

15. A lithographic mask comprising a reflective substrate having a radiation absorbing material in an arrangement, the arrangement configured to apply a pattern to a cross-section of a radiation beam having a certain wavelength, wherein the radiation absorbing material arrangement comprises a plurality of structures having a first pitch and a plurality of structures having a second pitch different compared to the first pitch, and wherein the absorbing material has a thickness which is such that a focus difference between the best focus plane for the structures having the first pitch and a best focus plane for the structures having the second pitch substantially corresponds to a minimum of a variation of the focus difference versus absorbing material thickness when projected using a projection system of a lithographic apparatus.

16. A lithographic mask comprising a reflective substrate having a radiation absorbing material in an arrangement, the arrangement configured to apply a pattern to a cross-section of a radiation beam of the certain wavelength, wherein the radiation absorbing material arrangement comprises a plurality of structures having a first pitch and a plurality of structures having a second pitch different compared to the first pitch, and wherein the absorbing material has a thickness which is such that an image shift difference between the image shift experienced by the structures having the first pitch and the image shift experience by the structures having the second pitch substantially corresponds to a minimum of a variation of the image shift difference versus absorbing material thickness when projected using a projection system of a lithographic apparatus.

17. The lithographic mask according to any of clauses 13 to 16, wherein the first pitch, as measured after projection by the projection system of the lithographic apparatus, is substantially half of the wavelength of the certain wavelength.

18. The lithographic mask according to any of clauses 13 to 16, wherein the first pitch, as measured after projection by the projection system of the lithographic apparatus, is smaller than the certain wavelength and the second pitch, as measured after projection by the projection system of the lithographic apparatus, is larger than the certain wavelength.

19. A blank mask comprising a substrate substantially transmissive for radiation of a certain wavelength, the substrate having a radiation absorbing material, the radiation absorbing material being etchable to generate a pattern in the radiation absorbing material, wherein a thickness of the radiation absorbing material is such that following etching the radiation absorbing material has a thickness which is substantially equal to the certain wavelength divided by a refractive index of the radiation absorbing material.

20. A blank mask comprising a reflective substrate having a radiation absorbing material, the radiation absorbing material being etchable to generate a pattern in the radiation absorbing material, wherein a thickness of the radiation absorbing material is such that following etching the radiation absorbing material has a thickness which substantially corresponds to a minimum of a variation of the focus difference versus absorbing material thickness when projected at a certain wavelength using a projection system of a lithographic apparatus.

21. The blank mask according to clause 19 or clause 20, wherein a layer of a radiation sensitive resist is provided over the radiation absorbing material.

22. A method of determining a thickness of a radiation absorbing material to be provided to a lithographic mask, the lithographic mask comprising a substrate substantially transmissive for radiation of a certain wavelength and the substrate comprising the radiation absorbing material arranged to form a plurality of structures for imaging via a projection system of a lithographic apparatus, the method comprising:
  selecting a plurality of structures having different pitches,
  determining best focus planes of the selected structures when imaged via the projection system, the best focus planes being determined for different thicknesses of the radiation absorbing material, and
  selecting the thickness of the radiation absorbing material for which the plurality of structures have substantially equal best focus planes when imaged using the projection system.

23. A method of determining a thickness of a radiation absorbing material to be provided to a lithographic mask, the lithographic mask comprising a substrate substantially transmissive for radiation of a certain wavelength and the substrate comprising the radiation absorbing material arranged to form a plurality of structures for imaging via a projection system of a lithographic apparatus, the method comprising:
  selecting a plurality of structures having different pitches,
  determining image shifts of the selected structures when imaged via the projection system, the image shifts being determined for different thicknesses of the radiation absorbing material, and
  selecting the thickness of the radiation absorbing material for which the plurality of structures have substantially equal image shifts when imaged using the projection system.

24. A method of determining a thickness of a radiation absorbing material to be provided to a lithographic mask, the lithographic mask comprising a reflective substrate and the substrate comprising the radiation absorbing material arranged to form a plurality of structures for imaging using a projection system of a lithographic apparatus, the method comprising:
  selecting a plurality of structures having different pitches,
  determining best focus planes of the selected structures when imaged via the projection system using a certain wavelength, the best focus planes being determined for different thicknesses of the radiation absorbing material, and
  selecting the thickness of the radiation absorbing material to be a thickness at which a variation, as a function of absorbing material thickness, of a difference between best focus planes of the selected structures substantially corresponds to a minimum when the structures are imaged using the projection system.

25. A method of determining a thickness of a radiation absorbing material to be provided to a lithographic mask, the lithographic mask comprising a reflective substrate and the substrate comprising the radiation absorbing material arranged to form a plurality of structures for imaging using a projection system of a lithographic apparatus, the method comprising:

selecting a plurality of structures having different pitches, determining image shifts of the selected structures when imaged via the projection system using a certain wavelength, the image shifts being determined for different thicknesses of the radiation absorbing material, and selecting the thickness of the radiation absorbing material to be a thickness at which a variation, as a function of absorbing material thickness, of a difference between image shifts of the selected structures substantially corresponds to a minimum when the structures are imaged using the projection system.

26. The method according to any of clauses 22 to 25, wherein the determining the best focus plane or the determining the image shift is performed by simulating the projection of the structures using the projection system.

27. The method according to any of clauses 22 to 26, wherein a first structure in the plurality of structures comprises a first pitch, as measured after projection by the projection system, having a dimension of substantially half of the wavelength of the certain wavelength.

28. The method according to any of clauses 22 to 26, wherein a first structure in the plurality of structures comprises a pitch being smaller than the certain wavelength, and wherein a second structure in the plurality of structures comprises a pitch being larger than the certain wavelength, the pitches being as measured after projection by the projection system.

29. The method according to any of clauses 22 to 28, wherein the selecting the thickness comprises defining a range within which the thickness is chosen.

30. The method according to clause 29, wherein the selecting the thickness further comprises selecting the thickness of the absorbing material depending on a phase-shifting characteristic of the absorbing material to the radiation of the certain wavelength.

31. The method according to clause 30, wherein the thickness of the absorbing material is further selected to optimize the phase-shifting characteristic of the absorbing material.

32. A computer program product configured to perform the method according to any of clauses 22 to 31.

33. A lithographic apparatus comprising:

a mask according to any preceding clause a support structure to support the mask, the mask serving to impart a radiation beam with a pattern in its cross-section;

a substrate table to hold a substrate; and a projection system to project the patterned radiation beam onto a target portion of the substrate.

34. The lithographic apparatus according to clause 33, wherein the radiation beam is a polarized radiation beam.

35. The lithographic apparatus according to clause 34, wherein the polarized radiation beam has at least two polarization states, an intensity in a first polarization state being different from an intensity in a second polarization state.

36. A method comprising:

providing a beam of radiation with a certain wavelength using an illumination system;

using a mask according to any preceding clause to impart the radiation beam with a pattern in its cross-section; and projecting the patterned radiation beam onto a target portion of a substrate.

It will be appreciated that aspects of the present invention can be implemented in any convenient way including by way of suitable hardware and/or software. Alternatively, a programmable device may be programmed to implement embodiments of the invention. The invention therefore also provides suitable computer programs for implementing aspects of the invention. Such computer programs can be carried on suitable carrier media including tangible carrier media (e.g. hard disks, CD ROMs and so on) and intangible carrier media such as communications signals.

The invention claimed is:

1. A lithographic mask comprising a substrate substantially transmissive for radiation of a certain wavelength, the substrate having a radiation absorbing material in an arrangement, the arrangement configured to apply a pattern to a cross-section of a radiation beam of the certain wavelength, wherein the radiation absorbing material arrangement comprises a plurality of structures having a first pitch and a plurality of structures having a second pitch different compared to the first pitch, and wherein the absorbing material has a thickness which is such that the structures having the first pitch and the structures having the second pitch will have substantially equal best focus planes when projected using a projection system of a lithographic apparatus.

2. The lithographic mask according to claim 1, wherein the first pitch, as measured after projection by the projection system of the lithographic apparatus, is smaller than the certain wavelength and the second pitch, as measured after projection by the projection system of the lithographic apparatus, is larger than the certain wavelength.

3. A lithographic mask comprising a substrate substantially transmissive for radiation of a certain wavelength, the substrate having a radiation absorbing material in an arrangement, the arrangement configured to apply a pattern to a cross-section of a radiation beam of the certain wavelength, wherein the radiation absorbing material arrangement comprises a plurality of structures having a first pitch and a plurality of structures having a second pitch different compared to the first pitch, and wherein the absorbing material has a thickness which is such that the structures having the first pitch and the structures having the second pitch will experience substantially equal image shifts when projected using a projection system of a lithographic apparatus.

4. The lithographic mask according to claim 3, wherein the first pitch, as measured after projection by the projection system of the lithographic apparatus, is smaller than the certain wavelength and the second pitch, as measured after projection by the projection system of the lithographic apparatus; is larger than the certain wavelength.

5. A lithographic mask comprising a reflective substrate having a radiation absorbing material in an arrangement, the arrangement configured to apply a pattern to a cross-section of a radiation beam having a certain wavelength, wherein the radiation absorbing material arrangement comprises a plurality of structures having a first pitch and a plurality of structures having a second pitch different compared to the first pitch, and wherein the absorbing material has a thickness which is such that a focus difference between the best focus plane for the structures having the first pitch and a best focus plane for the structures having the second pitch substantially corresponds to a minimum of a variation of the focus difference versus absorbing material thickness when projected using a projection system of a lithographic apparatus.

6. The lithographic mask according to claim 5, wherein the first pitch, as measured after projection by the projection system of the lithographic apparatus, is smaller than the certain wavelength and the second pitch, as measured after projection by the projection system of the lithographic apparatus, is larger than the certain wavelength.

7. A lithographic mask comprising a reflective substrate having a radiation absorbing material in an arrangement, the arrangement configured to apply a pattern to a cross-section of a radiation beam of the certain wavelength, wherein the radiation absorbing material arrangement comprises a plurality of structures having a first pitch and a plurality of structures having a second pitch different compared to the first pitch, and wherein the absorbing material has a thickness which is such that an image shift difference between the image shift experienced by the structures having the first pitch and the image shift experience by the structures having the second pitch substantially corresponds to a minimum of a variation of the image shift difference versus absorbing material thickness when projected using a projection system of a lithographic apparatus.

8. The lithographic mask according to claim 7, wherein the first pitch, as measured after projection by the projection system of the lithographic apparatus, is substantially half of the wavelength of the certain wavelength.

9. The lithographic mask according to claim 7, wherein the first pitch, as measured after projection by the projection system of the lithographic apparatus, is smaller than the certain wavelength and the second pitch, as measured after projection by the projection system of the lithographic apparatus, is larger than the certain wavelength.

10. A method of determining a thickness of a radiation absorbing material to be provided to a lithographic mask, the lithographic mask comprising a substrate substantially transmissive for radiation of a certain wavelength and the substrate comprising the radiation absorbing material arranged to form a plurality of structures for imaging via a projection system of a lithographic apparatus, the method comprising:
    selecting a plurality of structures having different pitches,
    determining best focus planes of the selected structures when imaged via the projection system, the best focus planes being determined for different thicknesses of the radiation absorbing material, and
    selecting the thickness of the radiation absorbing material for which the plurality of structures have substantially equal best focus planes when imaged using the projection system.

11. The method according to claim 10, wherein the first pitch, as measured after projection by the projection system of the lithographic apparatus, is smaller than the certain wavelength and the second pitch, as measured after projection by the projection system of the lithographic apparatus, is larger than the certain wavelength.

12. A method of determining a thickness of a radiation absorbing material to be provided to a lithographic mask, the lithographic mask comprising a substrate substantially transmissive for radiation of a certain wavelength and the substrate comprising the radiation absorbing material arranged to form a plurality of structures for imaging via a projection system of a lithographic apparatus, the method comprising:
    selecting a plurality of structures having different pitches,
    determining image shifts of the selected structures when imaged via the projection system, the image shifts being determined for different thicknesses of the radiation absorbing material, and
    selecting the thickness of the radiation absorbing material for which the plurality of structures have substantially equal image shifts when imaged using the projection system.

13. The method according to claim 12, wherein the first pitch, as measured after projection by the projection system of the lithographic apparatus, is smaller than the certain wavelength and the second pitch, as measured after projection by the projection system of the lithographic apparatus, is larger than the certain wavelength.

14. A method of determining a thickness of a radiation absorbing material to be provided to a lithographic mask, the lithographic mask comprising a reflective substrate and the substrate comprising the radiation absorbing material arranged to form a plurality of structures for imaging using a projection system of a lithographic apparatus, the method comprising:
    selecting a plurality of structures having different pitches,
    determining best focus planes of the selected structures when imaged via the projection system using a certain wavelength, the best focus planes being determined for different thicknesses of the radiation absorbing material, and
    selecting the thickness of the radiation absorbing material to be a thickness at which a variation, as a function of absorbing material thickness, of a difference between best focus planes of the selected structures substantially corresponds to a minimum when the structures are imaged using the projection system.

15. The method according to claim 14, wherein the first pitch, as measured after projection by the projection system of the lithographic apparatus, is smaller than the certain wavelength and the second pitch, as measured after projection by the projection system of the lithographic apparatus, is larger than the certain wavelength.

16. A method of determining a thickness of a radiation absorbing material to be provided to a lithographic mask, the lithographic mask comprising a reflective substrate and the substrate comprising the radiation absorbing material arranged to form a plurality of structures for imaging using a projection system of a lithographic apparatus, the method comprising:
    selecting a plurality of structures having different pitches,
    determining image shifts of the selected structures when imaged via the projection system using a certain wavelength, the image shifts being determined for different thicknesses of the radiation absorbing material, and
    selecting the thickness of the radiation absorbing material to be a thickness at which a variation, as a function of absorbing material thickness, of a difference between image shifts of the selected structures substantially corresponds to a minimum when the structures are imaged using the projection system.

17. The method according to claim 16, wherein the first pitch, as measured after projection by the projection system of the lithographic apparatus, is substantially half of the wavelength of the certain wavelength.

18. The method according to claim 16, wherein the first pitch, as measured after projection by the projection system of the lithographic apparatus, is smaller than the certain wavelength and the second pitch, as measured after projection by the projection system of the lithographic apparatus, is larger than the certain wavelength.

* * * * *